(12) United States Patent
Tiede (10) Patent No.: US 7,264,975 B1
(45) Date of Patent: Sep. 4, 2007

(54) METAL PROFILE FOR INCREASED LOCAL MAGNETIC FIELDS IN MRAM DEVICES AND METHOD FOR MAKING THE SAME

(75) Inventor: John W. Tiede, Colorado Springs, CO (US)

(73) Assignee: Cypress Semiconductor Corp., San Jose, CA (US)

( * ) Notice: Subject to any disclaimer, the term of this patent is extended or adjusted under 35 U.S.C. 154(b) by 318 days.

(21) Appl. No.: 10/940,475

(22) Filed: Sep. 14, 2004

Related U.S. Application Data (60) Provisional application No. 60/505,813, filed on Sep. 25, 2003.

(51) Int. Cl.
*H01L 29/76* (2006.01)

(52) U.S. Cl. .................... 438/3; 257/295; 365/171; 365/173

(58) Field of Classification Search ............ 438/3
See application file for complete search history.

(56) References Cited

U.S. PATENT DOCUMENTS

| | | | |
|---|---|---|---|
| 6,005,800 A | 12/1999 | Koch et al. | |
| 6,555,858 B1 | 4/2003 | Jones et al. | |
| 6,576,480 B2 | 6/2003 | Chen | |
| 6,597,049 B1 | 7/2003 | Bhattacharyya et al. | |
| 6,627,932 B1 * | 9/2003 | Drewes | 257/295 |
| 6,704,220 B2 * | 3/2004 | Leuschner | 365/173 |
| 6,822,278 B1 | 11/2004 | Koutny | |
| 6,891,193 B1 | 5/2005 | Schwarz | |
| 2002/0153580 A1 | 10/2002 | Hosotani et al. | |
| 2003/0104636 A1 | 6/2003 | Bloomquist et al. | |

* cited by examiner

*Primary Examiner*—Jerome Jackson
*Assistant Examiner*—José R. Diaz
(74) *Attorney, Agent, or Firm*—Kevin L. Daffer; Daffer McDaniel, LLP (57) ABSTRACT

A method for fabricating a magnetic random access memory circuit (MRAM) and a MRAM circuit resulting therefrom are provided. The method includes depositing a first conductive layer upon and in contact with a plurality of magnetic cell junctions and selectively removing portions of the first conductive layer arranged above the plurality of magnetic cell junctions. In addition, the method includes depositing a second conductive layer above remaining portions of the first conductive layer and the plurality of magnetic cell junctions. The resulting circuit may include a field-inducing line having thickness and/or width variations relative to underlying magnetic cell junctions.

20 Claims, 3 Drawing Sheets

METAL PROFILE FOR INCREASED LOCAL MAGNETIC FIELDS IN MRAM DEVICES AND METHOD FOR MAKING THE SAME

PRIORITY APPLICATION

The present application claims priority to provisional application No. 60/505,813 entitled "Metal Profile for Increased Local Magnetic Fields in MRAM Devices and Method for Making the Same," filed Sep. 25, 2003.

BACKGROUND OF THE INVENTION

1. Field of the Invention

This invention relates to magnetic memory devices, and more particularly, to field-inducing line configurations arranged adjacent to magnetic cell junctions.

2. Description of the Related Art

The following descriptions and examples are given as background information only.

Recently, the development of magnetic random access memory (MRAM) devices to function as viable non-volatile memory circuits has been on the forefront of microelectronic technology. In general, MRAM circuits exploit the electromagnetic properties of magnetoresistive materials to set and maintain information stored within individual magnetic memory cell junctions of the circuit. More specifically, MRAM circuits utilize magnetization direction to store information within magnetic cell junctions, and differential resistance measurements to read information from the magnetic cell junctions. An MRAM circuit generally includes one or more conductive lines with which to generate magnetic fields such that the magnetization directions of one or more magnetic cell junctions of the MRAM circuit may be set. In some embodiments, the conductive lines may be referred to as "field-inducing lines."

Typically, the conductive lines are formed as substantially straight and uniform structures of metal spaced parallel and perpendicular to each other within a plane comprising the magnetic cell junctions. Alternatively stated, the conductive lines are generally arranged in series of columns and rows having magnetic cell junctions interposed at the overlap points of the conductive lines. In this manner, the circuit may include a plurality of memory cells arranged within an array. In some cases, the conductive lines may be referred to as "bit" and "digit" lines. "Bit" lines may refer to the conductive lines that are arranged in electrical contact with magnetic junctions and are used for both the write and read operations of the array. "Digit" lines, on the other hand, may refer to the conductive lines spaced vertically adjacent to the magnetic junctions and are used primarily during write operations of the array.

In some embodiments, an individual magnetic junction can be written to by applying current simultaneously along a bit line and a digit line corresponding to the particular magnetic junction. Such an individual magnetic junction may herein be referred to as a selected magnetic junction, or the magnetic junction intentionally targeted for a writing procedure. During the writing procedure, however, the multitude of other magnetic junctions arranged vertically adjacent to the bit line and the digit line corresponding to the selected junction will also sense current. Such magnetic junctions are herein referred to as half-selected junctions, or disturbed junctions since the magnetic field induced about them is generated from one field-inducing line rather than two field-inducing lines. Even though a smaller magnetic field is induced about these disturbed cells, variations within the magnetic junctions may allow the magnetic field induced by one current carrying line to switch the magnetization directions of one or more of the disturbed cells. Such variations may include variations in the shapes and sizes of magnetic cell junctions, as well as the presence of defects.

In some cases, the variations of the cell junctions may cause the amount of current needed to switch magnetic cell junctions in the array to vary, thereby reducing the reliability of the device. In this manner, the write selectivity of the MRAM array may be reduced. Write selectivity, as used herein, may refer to the relative difference (i.e., current margin) between the amount of current responsible for switching the magnetization of a disturbed cell and the amount of current needed to switch the magnetization of a selected cell. Consequently, a reduction in write selectivity reduces the tolerance of the current used to reliably switch selected cells without switching disturbed cells within an array. In some cases, the tolerance may be too small, allowing a false bit to be unintentionally written to one or more of the disturbed cells and in turn, decrease the functionality of the array.

Accordingly, it would be advantageous to develop an MRAM device configuration that reduces the current needed to switch magnetic directions of MRAM cell junctions. In addition, it would be advantageous to develop an MRAM device configuration that offers more accurate and uniform write selectivity within an MRAM array. Furthermore, it would be beneficial to develop a method of fabricating an MRAM device with such configurations.

SUMMARY OF THE INVENTION

The problems outlined above may be in large part addressed by a magnetic random access memory (MRAM) device that includes a conductive line configured to induce a magnetic field with a higher magnitude along at least a portion of a magnetic cell junction than along a spacing arranged adjacent to the magnetic cell junction. In addition, a method for fabricating a MRAM circuit with such a configuration is provided. In particular, a method is provided which includes depositing a first conductive layer upon and in contact with a plurality of magnetic cell junctions and selectively removing portions of the first conductive layer arranged above the plurality of magnetic cell junctions. In some cases, the step of selectively removing may include removing portions of the first conductive layer such that the one or more of the magnetic cell junctions are exposed. In other embodiments, however, the step of selectively removing may include reducing the thickness of the first conductive layer above the plurality of magnetic cell junctions such that a smaller portion of the first conductive layer remains above the magnetic cell junctions. In other words, the method may include removing portions of the first conductive layer to a level above the upper surfaces of the magnetic cell junctions. In either case, the step of selectively removing may include forming a trench with a dimension larger than a length of at least one of the magnetic cell junctions. Alternatively stated, the method may include forming a trench within the first conductive layer having lateral boundaries which extend beyond the lateral boundaries of an underlying magnetic cell junction.

In addition to removing portions of the first conductive layer, the method may include depositing a second conductive layer above remaining portions of the first conductive layer and the plurality of magnetic cell junctions. In some embodiments, the second conductive layer may be deposited to a thickness less than a thickness of the first conductive layer. For example, in some cases, the thickness of the second conductive layer may be at least approximately 75% of the thickness of the first conductive layer. In other embodiments, the thickness of the second conductive layer may be less than approximately 75% of the thickness of the first conductive layer. In any case, the second conductive layer may, in some embodiments include a material similar to the first conductive layer. Alternatively, the second conductive layer may include a different material than the first conductive layer. For example, in some cases, the first conductive layer may include copper and the second conductive layer may include aluminum. In any case, the method may include patterning the first and second conductive layers. In some cases, the first and second conductive layers may be patterned such that portions of the first and/or second conductive layers above the plurality of magnetic cell junctions are narrower than portions of the first and/or second conductive layers above the spaces between the plurality of magnetic cell junctions.

As noted above, a MRAM circuit fabricated from the method described above is provided herein. In particular, a MRAM circuit is provided which includes a field-inducing line having a plurality of separated conductive segments arranged above a dielectric material arranged between a plurality of magnetic cell junctions. In some cases, the separated conductive segments may be spaced apart by a distance greater than a length of one of the magnetic cell junctions. For example, in some embodiments, the separated conductive segments may be spaced apart by a distance at least approximately 20% greater than the length of one of the magnetic cell junctions. In any case, the field-inducing line may further include a conductive layer arranged upon and in contact with the plurality of separated conductive segments and the plurality of magnetic cell junctions. In some embodiments, the field-inducing line may be configured to induce a magnetic field with a higher magnitude along at least a portion of the magnetic cell junction than along a spacing arranged adjacent to the magnetic cell junction. Alternatively stated, the field-inducing line may be adapted to conduct a higher density of current above a magnetic junction than above a spacing arranged adjacent to the magnetic cell junction. For example, in some cases, the thickness of the conductive layer may be less than a thickness of the plurality of the separated conductive segments. In addition or alternatively, the conductive layer may include narrower portions in regions above the plurality of magnetic cell junctions than in regions above the plurality of separated conductive segments.

There may be several advantages to forming the MRAM device described herein. In particular, the MRAM device described herein may provide more accurate and uniform write selectivity among magnetic cell junctions. In this manner, the reliability of the device may be increased. In addition, the MRAM device described herein may allow lower current to be used to switch the magnetic directions of the MRAM cell junctions within the array. Consequently, the MRAM device described herein may function with lower power requirements than conventional MRAM devices. In addition, the use of lower current may allow smaller on-pitch current drivers to be used, reducing the die size of the MRAM device.

BRIEF DESCRIPTION OF THE DRAWINGS

Other objects and advantages of the invention will become apparent upon reading the following detailed description and upon reference to the accompanying drawings in which:

FIG. 5a depicts a partial cross-sectional view of the microelectronic topography in which another conductive layer has been deposited subsequent to the formation of the trenches in FIG. 4a;

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, an exemplary embodiment of a method for fabricating a magnetic random access memory (MRAM) circuit with a conductive line configured to induce a higher magnetic field along at least a portion of a magnetic cell junction than along a spacing arranged adjacent to the magnetic cell junction is shown in FIGS. 1-6. In particular, FIGS. 1-6 depict a method for forming a field-inducing line which is configured to conduct different densities of current therethrough, particularly relative to underlying magnetic cell junctions. Although the method illustrated in FIGS. 1-6 depicts a method for forming a field-inducing line in contact with magnetic cell junctions and, therefore, depicts a method for forming a bit line, the method described herein may alternatively be used to form a digit line spaced above magnetic cell junctions. In addition or alternatively, the devices described herein may include field-inducing lines arranged underneath magnetic cell junctions which are configured to induce a variation in magnetic fields. As such, it is noted, that the method and structural configurations described herein are not restricted to the embodiments shown in FIGS. 1-6. In particular, the method and structural configurations described herein may be applied to any magnetic field-inducing line arranged within a topography including a magnetic cell junction.

Figure 1:
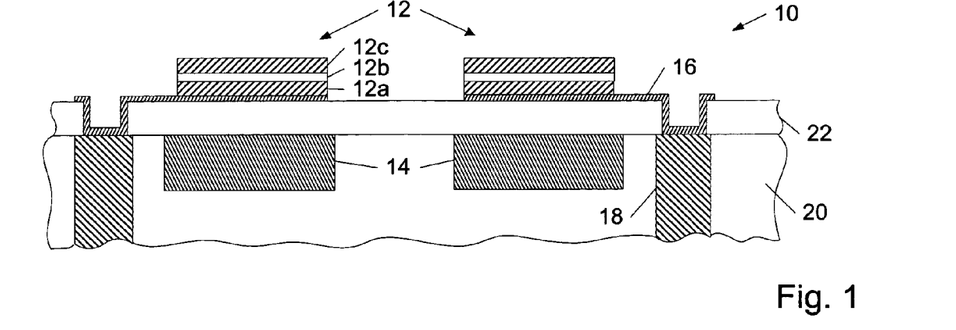
FIG. 1 depicts a partial cross-sectional view of a microelectronic topography with a plurality of magnetic cell junctions.

FIG. 1 illustrates microelectronic topography 10 including magnetic cell junctions 12 patterned from a stack of layers. In particular, microelectronic topography 10 illustrates magnetic cell junctions 12 patterned from magnetic layer/s 12a, tunneling layer 12b, and magnetic layer/s 12c. Such layers may generally include materials known in the industry of MRAM fabrication for forming magnetic tunneling junction (MTJ) or giant magnetoresistance (GMR) structures. Consequently, the MRAM circuit described herein is not restricted to a particular layer configuration or composition of magnetic cell junctions. In some embodiments, magnetic cell junctions 12 may include layers in addition to layers 12a-12c. For example, in some embodiments, magnetic cell junctions 12 may include one or more capping layers arranged above magnetic layer/s 12c. In some cases, the capping layer may be patterned along with layers 12a-12c. In yet other cases, however, the capping layer may be formed subsequent to patterning layers 12a-12c as described in more detail below. In any case, the patterning of layers 12a-12c may generally include photolithography patterning processes known in the semiconductor fabrication industry.

In addition to magnetic cell junctions 12, microelectronic topography 10 may include digit lines 14, electrodes 16, contacts 18, and dielectrics 20 and 22. As shown in FIG. 1, electrodes 16 may extend above dielectric 22 to respectively connect magnetic cell junctions 12 to contacts 18. In addition, digit lines 14 and contacts 18 may be insulated within interlevel dielectric layer 20. In general, electrodes 16, contacts 18, and digit lines 14 may be adapted to pass current and, therefore, may be made of any conductive material, such as doped polysilicon, aluminum, copper, tantalum, titanium, tungsten, or any alloy of such metals. In some embodiments, microelectronic topography 10 may include structures and layers not shown in FIG. 1. In particular, microelectronic topography 10 may include structures and/or layers arranged above, below and in-between the structures and layers shown in FIG. 1. For example, microelectronic topography 10 may include, gate structures, additional interlevel dielectrics, contacts, vias, and interconnect lines. Moreover, microelectronic topography 10 may continue beyond the edges of the topography shown in FIG. 1. In this manner, microelectronic topography 10 may include additional structures and layers arranged adjacent to the layers and structures shown in FIG. 1. In some embodiments, such additional structures and layers may be substantially similar to the layers and structures of FIG. 1. Consequently, the method described herein may include forming a field-inducing line over more than two magnetic cell junctions and, more preferably, over a plurality of magnetic cell junctions arranged within a row or column of a MRAM array.

Figure 2:
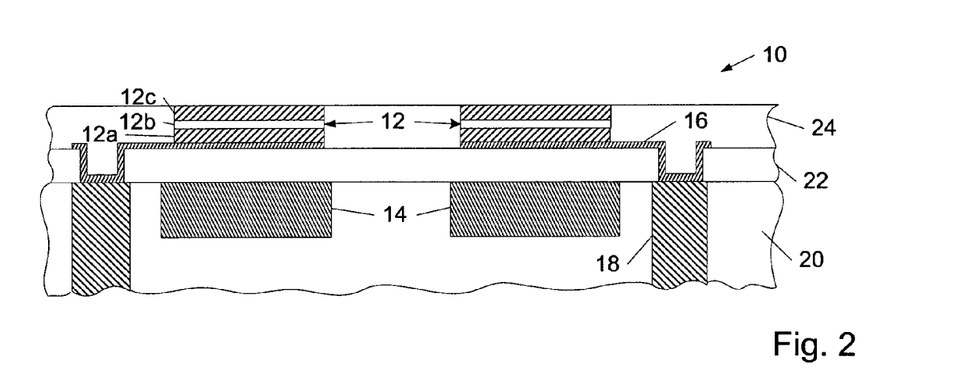
FIG. 2 depicts a partial cross-sectional view of the microelectronic topography illustrated in FIG. 1 having a dielectric layer arranged above the plurality of magnetic cell junctions.

Subsequent to patterning layers 12a-12c, dielectric layer 24 may, in some embodiments, be deposited upon microelectronic topography 10 as shown in FIG. 2. In particular, dielectric layer 24 may be deposited upon magnetic cell junctions 12 and exposed portions of electrodes 16 and dielectric 22. Such a layer may serve to isolate conductive materials from electrodes 16 as well as provide a surface upon which to form a field-inducing line with which to influence the logic states of magnetic cell junctions 12. In general, dielectric layer 24 may include any dielectric material used in the industry of semiconductor fabrication, such as but not limited to silicon dioxide, silicon nitride and silicon oxynitride. In addition, the deposition of dielectric layer 24 may include any deposition technique used in semiconductor fabrication, including but not limited to chemical vapor deposition and physical vapor deposition. Furthermore, dielectric layer 24 may be deposited to a level above the upper surface of magnetic cell junctions 12. Consequently, dielectric layer 24 may be deposited to a thickness of several hundred or a few thousand angstroms.

In some embodiments, dielectric layer 24 may be planarized to be substantially coplanar with the upper surfaces of magnetic cell junctions 12. In particular, dielectric layer 24 may be planarized to be substantially coplanar with magnetic layer/s 12c as shown in FIG. 2. In other embodiments, dielectric layer 24 may be planarized to be substantially coplanar with a capping layer arranged upon magnetic layer/s 12c. In yet other embodiments, dielectric layer 24 may not be planarized in order to form a substantially planar surface with the upper surfaces of magnetic cell junctions 12 as described in more detail below. As noted above, the patterning process of magnetic cell junctions 12 may sometimes include patterning a capping layer arranged above magnetic layer/s 12c. In other embodiments, however, a trench may be etched within dielectric layer 24 above magnetic cell junctions 12 and a material may be deposited within the trench to form a capping layer of the magnetic cell junctions. In such an embodiment, the capping layer material may, in some cases, be deposited to a depth coplanar with an upper surface the dielectric material to form a substantially coplanar surface. In other embodiments, the capping layer may be planarized to be substantially coplanar with the dielectric material. In yet other embodiments, the capping layer material may not be deposited to fill the trench and the dielectric material may be planarized to the level of the capping layer to form a substantially coplanar surface.

In any case, microelectronic topography 10 may, in some embodiments, be planarized to form a substantially coplanar surface between the dielectric material and upper surfaces of the magnetic cell junctions as noted above and, in some cases, to reduce the thickness of a capping layer. In general, the planarization of microelectronic topography 10 may include any polishing technique used in semiconductor fabrication, including but not limited to chemical mechanical polishing and/or fixed abrasive polishing. It is noted that the MRAM circuit described herein is not restricted to a particular technique with which to form magnetic cell junctions. Consequently, the method described herein is not restricted to the steps described in reference to FIGS. 1 and 2. In particular, the process steps described in reference to FIGS. 1 and 2 are exemplary.

Figure 3:
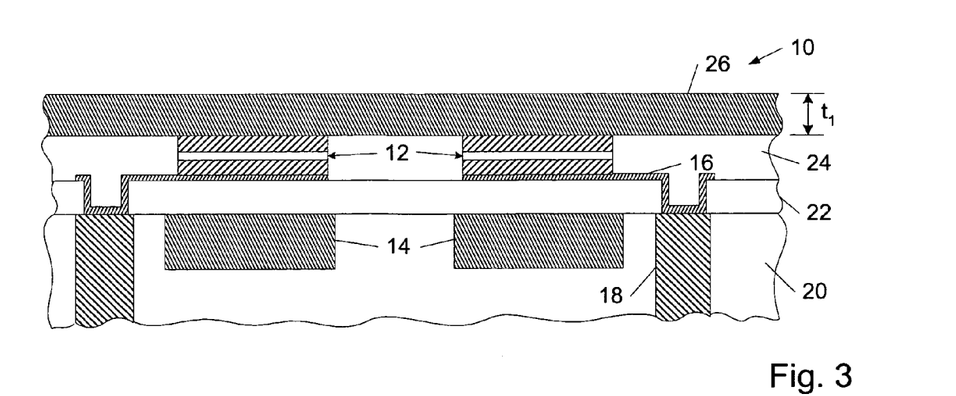
FIG. 3 depicts a partial cross-sectional view of the microelectronic topography having a conductive layer arranged above the dielectric layer and the plurality of magnetic cell junctions subsequent to the deposition of the dielectric layer in FIG. 2.

As shown in FIG. 3, conductive layer 26 may be deposited upon microelectronic topography 10 in contact with magnetic cell junctions 12. As will be described in more detail below, conductive layer 26 will be used to form a portion of a field-inducing line above magnetic cell junctions 12. Such a field-inducing line will be formed in contact with magnetic cell junctions 12 and, thus, may serve as a bit line. In other cases, however, the field-inducing line formed from the steps described in reference to FIGS. 3-6 may be spaced above magnetic cell junctions 12 and, consequently serve as a digit line. In such an embodiment, an interlevel dielectric may be deposited upon magnetic cell junctions 12 and dielectric layer 24 prior to the deposition of conductive layer 26 to provide adequate spacing between the subsequently formed digit line and cell junctions.

In general, conductive layer 26 may be adapted to pass current and, therefore, may be made of any conductive material, such as doped polysilicon, aluminum, copper, tantalum, titanium, tungsten, or any alloy of such metals. In addition, conductive layer 26 may be deposited to have a thickness $t_1$ between 4000 angstroms and approximately 8000 angstroms. Larger or smaller thicknesses of conductive layer 26 may be appropriate, however, depending on the material used and the design characteristics of the device. Such a deposition thickness may be less than the deposition thickness of conventional field-inducing lines since the field-inducing line formed from the method provided herein includes an additional conductive layer as discussed in more detail below in reference to FIGS. 5a and 5b. In any case, the deposition of conductive layer 26 may include any deposition technique used in semiconductor fabrication, including but not limited to chemical vapor deposition and physical vapor deposition.

Figure 4A:
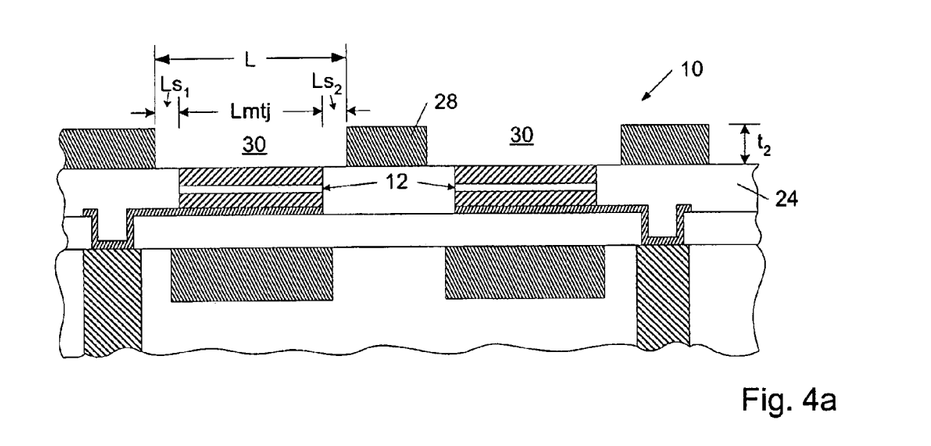
FIG. 4a depicts a partial cross-sectional view of the microelectronic topography having trenches formed within the conductive layer exposing the magnetic cell junctions subsequent to the deposition of the conductive layer in FIG. 3.
Figure 4B:
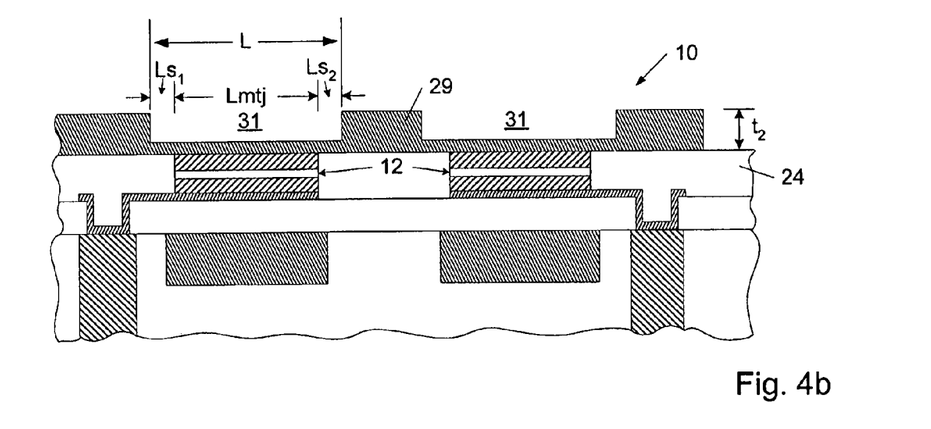
FIG. 4b depicts a partial cross-sectional view of the microelectronic topography having trenches formed within the conductive layer to a level spaced above the magnetic cell junctions subsequent to the deposition of the conductive layer in FIG. 3.

FIGS. 4a and 4b illustrate the selective removal of portions of conductive layer 26 overlying magnetic cell junctions 12. As shown in FIG. 4a, the removal process may, in some embodiments, expose magnetic cell junctions 12, forming separated conductive segments 28 over portions of dielectric layer 24. In other embodiments, however, the removal process may not expose magnetic cell junctions, but may rather reduce the thickness of portions of conductive layer 26 overlying magnetic cell junctions 12 to a level above the magnetic cell junctions as shown in FIG. 4b. In such an embodiment, contiguous conductive layer 29 may be formed having a variation of thicknesses across microelectronic topography 10. In particular, the portions of contiguous conductive layer 29 overlying magnetic cell junctions 12 may have a thickness between approximately 1% and approximately 99% of the thickness of portions of contiguous conductive layer 29 overlying regions adjacent to magnetic cell junctions 12. In some embodiments, it may be advantageous to minimize the thickness of the portions of contiguous conductive layer 29 overlying magnetic cell junctions 12. In particular, it may be beneficial to increase the current density within the portions of contiguous conductive layer 29 above the magnetic cell junctions such that magnetic fields induced from the conductive line are larger in the vicinity of the magnetic cell junctions. For example, in some embodiments, it may be advantageous for the portions of contiguous conductive layer 29 overlying magnetic cell junctions 12 to have a thickness between approximately 1% and approximately 20% of the thickness of portions of contiguous conductive layer 29 overlying regions adjacent to magnetic cell junctions 12.

Regardless of whether the removal process of FIG. 4a or FIG. 4b is used, the fabrication process described herein may include masking portions of conductive layer 26 such that portions of the conductive layer overlying magnetic cell junctions 12 are removed. In particular, portions of conductive layer 26 overlying dielectric 24 may be masked to form separated conductive segments 28 or contiguous conductive layer 29 as described above in reference to FIGS. 4a and 4b, respectively. In some embodiments, the selective removal processes may not include the removal of the masked portions of conductive layer 26 and, therefore, separated conductive segments 28 and portions of contiguous conductive layer 29 may include thicknesses substantially similar to the deposited thickness, $t_1$, of conductive layer 26. In yet other embodiments, the removal process may include removing portions of conductive layer 26 in such regions and, therefore, separated conductive segments 28 and/or portions of contiguous conductive layer 29 may include a thickness less than the deposited thickness of conductive layer 26. For example, the removal process may include an etch process which etches through the masking layer and underlying portions of conductive layer 26. In yet other embodiments, the masking layer may be removed during a suspension of the etching process, allowing the entire topography to be etched thereafter. In any case, the thicknesses of conductive segments 28 and portions of contiguous conductive layer 29 overlying dielectric layer 24 are referenced as $t_2$ as shown in FIGS. 4a and 4b.

As shown in FIGS. 4a and 4b, trenches 30 and 31 may be formed within microelectronic topography 10 by the selective removal processes described above. In some embodiments, the lateral boundaries of trenches 30 and 31 may extend beyond the lateral boundaries of magnetic cell junctions 12 as shown in FIGS. 4a and 4b. In particular, the boundaries of trenches 30 and 31 may extend beyond the lateral boundaries of magnetic cell junctions 12 by $Ls_1$ and $Ls_2$. In this manner, trenches 30 may include dimension L which is larger than length $L_{mtj}$ of a magnetic cell junction. In yet other cases, the boundaries of trenches 30 and/or 31 may not extend beyond the lateral boundaries of magnetic cell junctions 12. In some embodiments, the formation of trenches with larger lengths than the magnetic cell junctions may allow for alignment variations within the fabrication process. In particular, the larger dimension of trenches 30 and 31 may allow more leeway for the alignment of the trenches with magnetic cell junctions 12. In this manner, the portion of the subsequently formed field-inducing line over the magnetic cell junctions may be insured to have the smaller thickness as described in more detail below in reference to FIGS. 5a and 5b. In addition, the larger dimension of trenches 30 and 31 may insure the thickness of a subsequently deposited material over magnetic cell junctions 12 is substantially uniform.

In general, dimensions $Ls_1$, $Ls_2$ and $L_{mtj}$ and, thus, dimension L, may depend on the design specifications of the device. As a reference, however, an exemplary range for the lengths of magnetic cell junctions 12 may be between approximately 0.5 and approximately 1.5 microns. In addition, dimension $Ls_1$ and $Ls_2$ may, in some embodiments, be between approximately 5% and approximately 50% of $L_{mtj}$ or, more specifically, between approximately 30% and approximately 40% of $L_{mtj}$. In some embodiments, $Ls_1$ and $Ls_2$ may be substantially similar. In other embodiments, however, $Ls_1$ and $Ls_2$ may be substantially different. Consequently, although trenches 30 and 31 are shown to be centered over magnetic cell junctions 12, the trenches are not necessarily restricted to such an alignment.

Figure 5A:
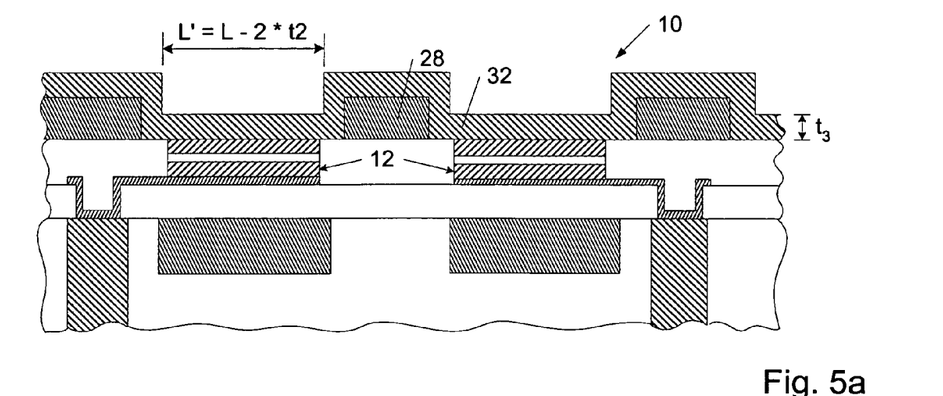
Figure 5B:
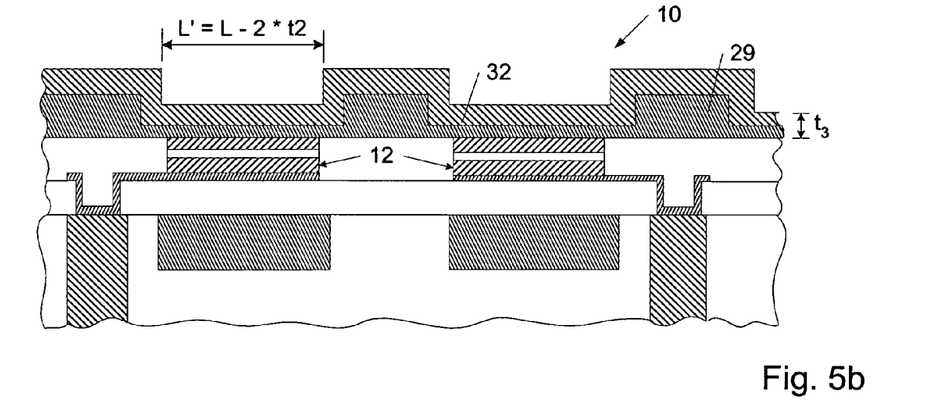
FIG. 5b depicts a partial cross-sectional view of the microelectronic topography in which another conductive layer has been deposited subsequent to the formation of the trenches in FIG. 4b.

As noted above, the field-inducing line provided herein may include an additional conductive layer. As such, the method described herein may include the deposition of a conductive layer within trenches 30 and 31. In particular, FIG. 5a illustrates the deposition of conductive layer 32 within trenches 30 and upon conductive segments 28. In addition, FIG. 5b illustrates the deposition of conductive layer 32 within trenches 31 and upon contiguous conductive layer 29. As with conductive layer 26, conductive layer 32 may be configured to pass current and, therefore, may include any conductive material, such as doped polysilicon, aluminum, copper, tantalum, titanium, tungsten, or any alloy of such metals. In some embodiments, conductive layer 32 may include a different material than conductive layer 26 and, therefore, may include a different material than conductive segments 28 and/or contiguous conductive layer 29. For example, conductive layer 32 may include copper and conductive segments 28 and/or contiguous conductive layer 29 may include aluminum. Such a configuration may advantageously position the relatively lower resistant copper material in close proximity to magnetic cell junctions 12 such that a larger magnetic field is induced about the junctions. In other embodiments, however, conductive layer 32 may include the same material as conductive layer 26.

In either case, conductive layer 32 may be deposited to a thickness which is less than the thickness of conductive segments 28 or contiguous conductive layer 29. In particular, conductive layer 32 may be deposited to thickness $t_3$, which is less than thickness $t_2$ depicted in FIGS. 4a and 4b. In general, thickness $t_3$ may depend on the design characteristics of the device. In some cases, however, it may be advantageous for thickness $t_3$ to be at least approximately 75% of thickness $t_2$. In particular, depositing conductive layer 32 to a thickness of at least 75% of thickness $t_2$ may avoid electromigration within the field-inducing line. In other embodiments, thickness $t_3$ may be less than approximately 75% of thickness $t_2$. In either case, an exemplary range of thickness for conductive layer 32 may be between approximately 1000 angstroms and approximately 5000 angstroms. Larger or smaller thicknesses of conductive layer 32 may be appropriate, however, depending on the material used for the layer and the design characteristics of the device. Since the strength of magnetic fields induced by a line is directly related to the thickness of the line, a relatively small thickness along a portion of the field-inducing line adjacent to a magnetic junction may allow a higher magnetic field to be generated as compared to a magnetic field generated from a relatively thick portion of the field-inducing line aligned with regions of the topography between the magnetic junctions. In some cases, the magnetic field generated over the magnetic cell junctions may be approximately 10% or greater than magnetic field generated by conventional MRAM devices.

Subsequent to the deposition of conductive layer 32, conductive layer 32 and conductive segments 28 or contiguous conductive layer 29 may be patterned to form a field-inducing line above a row or column of magnetic cell junctions. In some cases, the conductive layer 32 and conductive segment 28 or contiguous conductive layer 29 may be patterned to have substantially uniform pattern profile extending along the length of the field-inducing line. In other cases, however, conductive layer 32 and, in some embodiments, contiguous conductive layer 29 may be patterned to have a narrower pattern profile in regions above magnetic cell junctions 12 than in regions above the spacings between magnetic cell junctions 12. An exemplary layout of such an embodiment in illustrated in FIG. 6 and described in more detail below. "Pattern profiles," as used herein, may refer to the peripheral outline along a plan view of a structure or a region of a structure. In contrast, "cross-sectional profiles", as used herein, may refer to the cross-sectional peripheral outline of a structure or a region of a structure.

Figure 6:
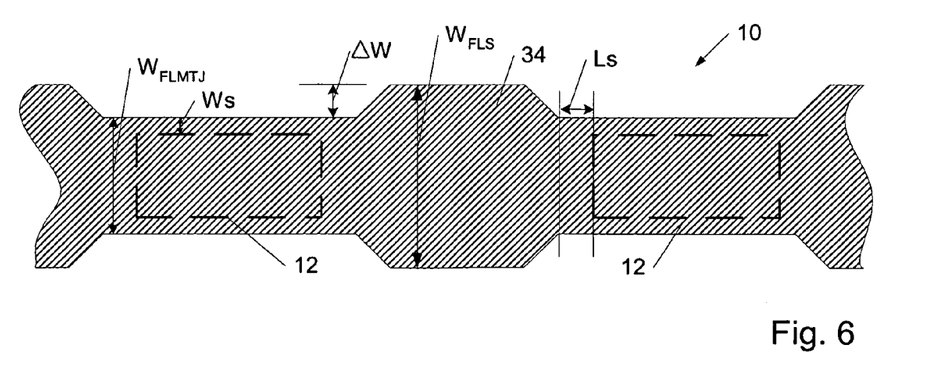
FIG. 6 depicts an exemplary top view of the microelectronic topography in which the two conductive layers have been patterned subsequent to the deposition of the other conductive layer in FIG. 5.

FIG. 6 illustrates an exemplary top view of microelectronic topography 10 subsequent to the patterning of conductive layer 32 and conductive segments 28 and contiguous conductive layer 29 in FIGS. 5a and 5b, respectively. In particular, FIG. 6 shows field-inducing line 34 patterned to have narrower portions aligned with magnetic cell junctions 12, which are outlined by dotted lines to indicate that they are below the field-inducing line, and relatively wider portions aligned with the spacings in between the magnetic cell junctions. To simplify the drawing, the boundaries of conductive layer 32 and conductive segments 28 and contiguous conductive layer 29 within field-inducing line 34 are not shown. In addition, layers and structures, other than magnetic cell junctions 12, underneath field-inducing line 34 are not shown to simplify the drawing. Patterning conductive layer 32 and, in some cases, conductive layer 26 to have a narrower pattern profile above magnetic cell junctions 12 than above the spacings above the cell junctions may offer the benefit of further increasing the magnetic field which can be induced by the formed field-inducing line. In particular, the portions of field-inducing line 34 adjacent to magnetic junctions 12 may allow a higher magnetic field to be generated as compared to the magnetic fields generated from portions of field-inducing line 34 aligned with regions of the topography between the magnetic junctions.

As shown in FIG. 6, the width of the portion of field-inducing line 34 aligned with magnetic cell junctions 12 is denoted as $W_{FLMTJ}$, the width of the portion of field-inducing line 34 aligned with the spacings between the magnetic cell junctions is denoted as $W_{FLS}$ and $\Delta W$ is half of the difference between the two dimensions, $W_{FLMTJ}$ and $W_{FLS}$. In other embodiments, $\Delta W$ may be greater or less than half of the difference between the two dimensions, $W_{FLMTJ}$ and $W_{FLS}$. In particular, the narrowed portions of field-inducing line 34 aligned along magnetic cell junctions 12 may not be centered over the magnetic cell junctions. Alternatively stated, field-inducing line 34 may be patterned such that a portion aligned along a magnetic cell junction has a region extending a greater distance from one edge of the magnetic cell junction than the other edge. In general, the dimensions of $W_{FLMTJ}$, $W_{FLS}$ and $\Delta W$ may depend on the design specification of the device. As a reference, however, an exemplary range for $W_{FLMTJ}$ may be approximately 5% to approximately 20% larger the width of magnetic cell junctions 12, which may typically range between approximately 1.0 micron and approximately 5 microns. Such a variation from the width of magnetic cell junctions 12 is denoted as $W_s$ in FIG. 6. In addition, $W_{FLS}$ may, in some embodiments, be approximately 5% to approximately 50% larger than $W_{FLMTJ}$ or, more specifically, approximately 30% to approximately 40% larger than $W_{FLMTJ}$.

Further processing of microelectronic electronic topography 10 may be conducted prior to or subsequent to the patterning of conductive layer 32 and conductive segment 28 and/or contiguous conductive layer 29. For example, in some cases, a cladding layer may be deposited upon conductive layer 32 prior or subsequent to the patterning process. Such a cladding layer may serve to prevent dissipation of the generated magnetic field from magnetic cell junctions 12. In addition, other layers or structures, such as a magnetic field shield layer and/or passivation layer, may be deposited upon microelectronic topography 10 subsequent to the patterning the field-inducing line to form an MRAM circuit.

Due to the variation of thickness and, sometimes, width of the field inducing line described herein, selected magnetic cell junctions of a device having such a field-inducing line may be exposed to higher magnetic fields than selected magnetic cell junctions in conventional devices. Consequently, the current required to switch selected magnetic cell junctions in the device described herein may be lower relative to current magnitudes used in conventional devices. As such, lower current magnitudes may be used for the device described above as compared to conventional devices. Consequently, the overall power requirements of a device including one or more sets of field-inducing lines (i.e., bit lines and/or digit lines) with the configuration described herein may be reduced as compared to a device having substantially straight and uniform-thickness bit and digit lines. In turn, a smaller on-pitch current driver may be used with the device described herein, reducing the die size of the resulting MRAM circuit.

In some cases, the configuration of a field-inducing line having the thickness and/or width variations described above may additionally or alternatively increase the write selectivity of a device. In particular, a device having one set of field-inducing lines (i.e., bit lines or digit lines) with the configuration described herein may increase the write selectivity of the device. Write selectivity, as used herein, may refer to the ratio of selected cells and disturbed cells switched during a write operation of a device. As stated above, selected magnetic cell junctions of the device described herein may be exposed to higher magnetic fields than in conventional devices. A device having two sets of field-inducing lines (i.e., both bit lines and digit lines) with such a configuration may not improve the write selectivity of a device since all of the disturbed cells are exposed to substantially similar levels of magnetic fields, as in conventional devices. A device having just one set of field-inducing lines with thickness and/or width variations relative to another set of field-inducing lines of the device, however, advantageously induces a higher magnetic field along half of the disturbed cells of the device. More specifically, only the disturbed cells aligned with the field-inducing lines having thickness and/or width variations are exposed to increased magnetic field magnitudes. As a result, the write selectivity of the device may be increased.

It will be appreciated to those skilled in the art having the benefit of this disclosure that this invention is believed to provide a method and a system for processing a microelectronic topography. Further modifications and alternative embodiments of various aspects of the invention will be apparent to those skilled in the art in view of this description. For example, the topography, device, and method described herein may be applied to the fabrication of any field-inducing line within MRAM circuit. In addition, field-inducing line configurations with thickness and/or width variations may be applied to bit lines and digit lines with the same MRAM circuit. It is intended that the following claims be interpreted to embrace all such modifications and changes and, accordingly, the drawings and the specification are to be regarded in an illustrative rather than a restrictive sense.

What is claimed is:

1. A method for fabricating a magnetic random access memory array, comprising:
    depositing a first conductive layer upon and in contact with a plurality of magnetic cell junctions;
    forming trenches within the first conductive layer above the magnetic cell junctions, wherein at least one of the trenches comprises lateral boundaries which extend beyond the lateral boundaries of an underlying magnetic cell junction; and
    depositing a second conductive layer above remaining portions of the first conductive layer and the plurality of magnetic cell junctions.

2. The method of claim 1, wherein the step of forming the trenches comprises removing portions of the first conductive layer such that the magnetic cell junctions are exposed.

3. The method of claim 1, wherein the step of forming the trenches comprises removing portions of the first conductive layer to a level above upper surfaces of the magnetic cell junctions.

4. The method of claim 1, wherein the step of depositing the second conductive layer comprises depositing a different material than the first conductive layer.

5. The method of claim 1, wherein the step of depositing the second conductive layer comprises depositing a similar material as the first conductive layer.

6. A method for fabricating a magnetic random access memory circuit, comprising:
    patterning a stack of layers to form a plurality of magnetic cell junctions;
    depositing a dielectric layer over and about the plurality of magnetic cell junctions;
    forming a substantially coplanar surface comprising the dielectric layer and upper surfaces of the plurality of magnetic cell junctions;
    depositing a first conductive layer upon and in contact with the dielectric layer and plurality of magnetic cell junctions;
    selectively removing portions of the first conductive layer arranged above the plurality of magnetic cell junctions; and
    depositing a second conductive layer above remaining portions of the first conductive layer and the plurality of magnetic cell junctions to a thickness less than a thickness of the first conductive layer.

7. The method of claim 6, wherein the step of selectively removing comprises removing portions of the first conductive layer such that the plurality of magnetic cell junctions are exposed.

8. The method of claim 6, wherein the step of selectively removing comprises forming a trench with a dimension larger than a length of at least one of the magnetic cell junctions.

9. The method of claim 6, further comprising patterning the second and first conductive layers such that portions of the second conductive layer above the plurality of magnetic cell junctions are narrower than portions of the second conductive layer above spaces between the plurality of magnetic cell junctions.

10. The method of claim 1, wherein at least one of the trenches comprises a lateral boundary which extends beyond a lateral boundary of an underlying magnetic cell junction by a distance between approximately 5% and approximately 50% of a length of the underlying magnetic cell junction.

11. The method of claim 6, wherein the step of depositing the second conductive layer comprises depositing the second conductive layer to a thickness greater than or equal to approximately 75% of a thickness of the first conductive layer.

12. The method of claim 6, wherein the step of depositing the second conductive layer comprises depositing a different material than the first conductive layer.

13. The method of claim 12, wherein the step of depositing the first conductive layer comprises depositing aluminum, and wherein the step of depositing the second conductive layer comprises depositing copper.

14. A method for fabricating a magnetic random access memory circuit, comprising:
    patterning a stack of layers to form a plurality of magnetic cell junctions;
    depositing a dielectric layer over and about the plurality of magnetic cell junctions;

forming a substantially coplanar surface comprising the dielectric layer and upper surfaces of the plurality of magnetic cell junctions;

depositing a first conductive layer upon and in contact with the dielectric layer and plurality of magnetic cell junctions;

selectively removing portions of the first conductive layer arranged above the plurality of magnetic cell junctions;

depositing a second conductive layer above remaining portions of the first conductive layer and the plurality of magnetic cell junctions; and patterning the second and first conductive layers such that portions of the second conductive layer above the plurality of magnetic cell junctions are narrower than portions of the second conductive layer above spaces between the plurality of magnetic cell junctions.

15. The method of claim 14, wherein the step of selectively removing comprises removing portions of the first conductive layer such that the plurality of magnetic cell junctions are exposed.

16. The method of claim 14, wherein the step of selectively removing comprises removing portions of the first conductive layer to a level above upper surfaces of the magnetic cell junctions.

17. The method of claim 16, wherein the step of selectively removing comprises removing portions of the first conductive layer such that a thickness of the first conductive layer above the upper surfaces of the magnetic cell junctions is between approximately 1% and approximately 20% of the thickness of the first conductive layer above the spaces between the magnetic cell junctions.

18. The method of claim 14, wherein the step of selectively removing comprises forming a trench with a dimension larger than a length of at least one of the magnetic cell junctions.

19. The method of claim 14, wherein the step of patterning comprises patterning the second and first conductive layers such that a width of a portion of the second conductive layer above an underlying magnetic cell junction is approximately 5% to approximately 20% larger than a width of the underlying magnetic cell junction.

20. The method of claim 14, wherein the step of patterning comprises patterning the second and first conductive layers such that widths of the portions of the second conductive layer above the spaces between the plurality of magnetic cell junctions are approximately 5% to approximately 50% larger than widths of the portions of the second conductive layer above the plurality of magnetic cell junctions.

* * * * *